United States Patent
Shi et al.

(10) Patent No.: US 11,626,349 B2
(45) Date of Patent: Apr. 11, 2023

(54) MULTILAYER HYBRID BATTERY SEPARATORS FOR LITHIUM ION SECONDARY BATTERIES AND METHODS OF MAKING SAME

(71) Applicant: Celgard, LLC, Charlotte, NC (US)

(72) Inventors: Lie Shi, Matthews, NC (US); Jill V. Watson, Lake Wylie, SC (US); Ronald W. Call, Fort Mill, SC (US); Ronnie E. Smith, Huntersville, NC (US)

(73) Assignee: Celgard, LLC, Charlotte, NC (US)

( * ) Notice: Subject to any disclaimer, the term of this patent is extended or adjusted under 35 U.S.C. 154(b) by 155 days.

(21) Appl. No.: 16/823,357

(22) Filed: Mar. 19, 2020

(65) Prior Publication Data

US 2020/0219796 A1    Jul. 9, 2020

Related U.S. Application Data

(62) Division of application No. 15/255,254, filed on Sep. 2, 2016, now Pat. No. 10,601,012, which is a division
(Continued)

(51) Int. Cl.
*H01M 50/403* (2021.01)
*H01L 23/485* (2006.01)
(Continued)

(52) U.S. Cl.
CPC .............. *H01L 23/485* (2013.01); *B32B 5/18* (2013.01); *B32B 27/32* (2013.01); *B32B 37/06* (2013.01);
(Continued)

(58) Field of Classification Search
CPC .. H01M 50/403; H01M 50/44; H01M 50/449; H01M 50/411
See application file for complete search history.

(56) References Cited

U.S. PATENT DOCUMENTS 4,539,256 A    9/1985  Shipman
4,588,633 A    5/1986  Kono et al.
(Continued)

FOREIGN PATENT DOCUMENTS

| | | |
|---|---|---|
| JP | 2001150583 | 6/2001 |
| JP | 2009-160933 | 7/2009 |
| JP | 2010-24502 | 10/2010 |

OTHER PUBLICATIONS

Kesting, Synthetic Polymeric Membranes, John Wiley & Sons, New York, NY (1985), pp. 290-297.
(Continued)

*Primary Examiner* — Olatunji A Godo
(74) *Attorney, Agent, or Firm* — Hammer & Associates, P.C.

(57) ABSTRACT

A multi-layered battery separator for a lithium secondary battery includes a first layer of a dry processed membrane bonded to a second layer of a wet processed membrane. The first layer may be made of a polypropylene based resin. The second layer may be made of a polyethylene based resin. The separator may have more than two layers. The separator may have a ratio of TD/MD tensile strength in the range of about 1.5-3.0. The separator may have a thickness of about 35.0 microns or less. The separator may have a puncture strength of greater than about 630 gf. The separator may have a dielectric breakdown of at least about 2000V.

16 Claims, 2 Drawing Sheets

Related U.S. Application Data of application No. 14/210,507, filed on Mar. 14, 2014, now Pat. No. 9,455,432.

(60) Provisional application No. 61/792,722, filed on Mar. 15, 2013.

(51) Int. Cl.

| | | |
|---|---|---|
| *B32B 5/18* | (2006.01) | |
| *B32B 27/32* | (2006.01) | |
| *B32B 37/06* | (2006.01) | |
| *B32B 37/12* | (2006.01) | |
| *H01M 10/0525* | (2010.01) | |
| *H01M 50/44* | (2021.01) | |
| *H01M 50/411* | (2021.01) | |
| *H01M 50/449* | (2021.01) | |
| *H01L 23/31* | (2006.01) | |
| *H01M 10/052* | (2010.01) | |
| *H01L 21/56* | (2006.01) | |

(52) U.S. Cl.
CPC .......... *B32B 37/12* (2013.01); *H01L 23/3107* (2013.01); *H01M 10/0525* (2013.01); *H01M 50/403* (2021.01); *H01M 50/411* (2021.01); *H01M 50/44* (2021.01); *H01M 50/449* (2021.01); *B32B 2250/22* (2013.01); *B32B 2250/246* (2013.01); *B32B 2255/20* (2013.01); *B32B 2266/025* (2013.01); *B32B 2307/204* (2013.01); *B32B 2307/54* (2013.01); *B32B 2307/558* (2013.01); *B32B 2323/04* (2013.01); *B32B 2323/10* (2013.01); *B32B 2457/10* (2013.01); *H01L 21/568* (2013.01); *H01L 2224/04105* (2013.01); *H01L 2224/12105* (2013.01); *H01L 2224/19* (2013.01); *H01L 2224/24* (2013.01); *H01L 2224/24145* (2013.01); *H01L 2224/32145* (2013.01); *H01L 2224/73267* (2013.01); *H01L 2224/82* (2013.01); *H01L 2224/96* (2013.01); *H01L 2924/19104* (2013.01); *H01M 10/052* (2013.01)

(56) References Cited

U.S. PATENT DOCUMENTS

| | | | |
|---|---|---|---|
| 4,600,633 | A | 7/1986 | Kono et al. |
| 4,620,955 | A | 11/1986 | Kono et al. |
| 5,480,745 | A | 1/1996 | Nishiyama et al. |
| 5,667,911 | A | 9/1997 | Yu et al. |
| 5,691,047 | A | 11/1997 | Kurauchi et al. |
| 5,691,077 | A | 11/1997 | Yu |
| 5,922,492 | A | 7/1999 | Takita et al. |
| 5,952,120 | A * | 9/1999 | Yu .................. H01M 50/411 264/288.4 |
| 2002/0136945 | A1* | 9/2002 | Call .................. H01M 50/403 429/144 |
| 2009/0169862 | A1* | 7/2009 | Rhee .................. B32B 38/0032 428/315.7 |
| 2009/0253032 | A1 | 10/2009 | Takita et al. |
| 2011/0176661 | A1* | 7/2011 | Li .................. H01M 50/431 429/246 |

OTHER PUBLICATIONS

Kesting, Synthetic Polymeric Membranes, John Wiley & Sons, New York, NY (1985), pp. 237-286.

* cited by examiner

MULTILAYER HYBRID BATTERY SEPARATORS FOR LITHIUM ION SECONDARY BATTERIES AND METHODS OF MAKING SAME

RELATED APPLICATIONS

This application is a Divisional of co-pending U.S. patent application Ser. No. 15/255,254, filed Sep. 2, 2016, which claims priority to U.S. patent application Ser. No. 14/210,507 filed Mar. 14, 2014, which is now U.S. Pat. No. 9,455,432, and which claimed the benefit of U.S. Provisional Patent Application Ser. No. 61/792,722 filed Mar. 15, 2013, both of which are incorporated herein by reference.

FIELD OF THE INVENTION

The present invention is directed to multi-layered battery separators, particularly separators for use in lithium ion secondary batteries.

BACKGROUND OF THE INVENTION

The use of multilayer microporous membranes as battery separators for lithium ion secondary batteries is known, for example, see patents U.S. Pat. Nos. 5,480,745, 5,691,047, 5,667,911, 5,691,077 and 5,952,120, each of which is incorporated herein by reference. These patents disclose monolayer and multilayer membranes which are comprised of one or more polyolefin layers made using a solvent free manufacturing process commonly known as the dry process. One such well known dry process is the Celgard® dry process which involves the formation of a film parison using either a co-extrusion die or a non-coextrusion die. This film parison is also known as a precursor membrane and has a nonporous microstructure.

Dry process multilayer separator membranes such as Celgard® separators made by Celgard LLC of Charlotte, N.C. have a unique microstructure, defined by pore size, porosity and tortuosity and inhibit dendrite growth and improve the cycle life of a lithium ion secondary rechargeable battery. See FIG. 1.

Microporous separator membranes can also be made by a wet process such as those described in U.S. Pat. Nos. 4,588,633, 4,600,633, 4,620,955, 4,539,256, 5,922,492 and US 2009/0253032, each of which is incorporated herein by reference, which disclose monolayer and multilayer membranes made using a manufacturing process which includes the use of a solvent. The wet process involves a phase inversion process such as, for example, a thermal phase inversion process (TIPs) where a polymeric material is combined with a process oil or a plasticizer to form a mixture which is extruded and cooled on a cast roll to form a precursor membrane. Pores are then formed in the precursor membrane when the membrane is stretched and the plasticizer is extracted or removed (these films may be stretched before or after the removal of the oil). The extraction step involves the use of a solvent, thus the origin of the name 'wet process'. Wet process separators have an anisotropic, non-oriented pore structure which is web-like in appearance under Scanning electron microscope (SEM). See FIG. 2. Wet process Polyethylene (PE) microporous separator membranes are made using a high molecular weight PE, typically 100,000 to 500,000, and/or an ultrahigh molecular weight PE, typically with a molecular weight >500,000, and sometimes with a molecular weight 1 million. Membranes made using the wet process are typically biaxially stretched and have high MD and TD tensile strength.

Microporous separator membranes made by dry process and the wet process have unique separator performance properties due to their different manufacturing methods. Microporous separator membranes made by dry process or the wet processes are both commonly used today as battery separators in lithium ion secondary rechargeable batteries.

There is a need for a new separator membrane combines the performance properties of dry process microporous membrane with that of a wet process microporous membrane to produce a superior performance separator membrane with balanced MD and TD tensile strength, high overall tensile strength, high puncture strength, good oxidation resistance and a shutdown function.

BRIEF SUMMARY OF THE INVENTION

A multi-layered battery separator for a lithium secondary battery includes a first layer of a dry processed membrane bonded to a second layer of a wet processed membrane. The first layer may be made of a polypropylene based resin. The second layer may be made of a polyethylene based resin. The separator may have more than two layers. The separator may have a ratio of TD/MD tensile strength in the range of about 1.5-3.0. The separator may have a thickness of about 35.0 microns or less. The separator may have a puncture strength of greater than about 630 gf. The separator may have a dielectric breakdown of at least about 2000V.

BRIEF DESCRIPTION OF THE DRAWINGS

For the purpose of illustrating the invention, there is shown in the drawings a form that is presently preferred; it being understood, however, that this invention is not limited to the precise arrangements and instrumentalities shown.

Process microporous separator membrane (prior art).

Figure 2:
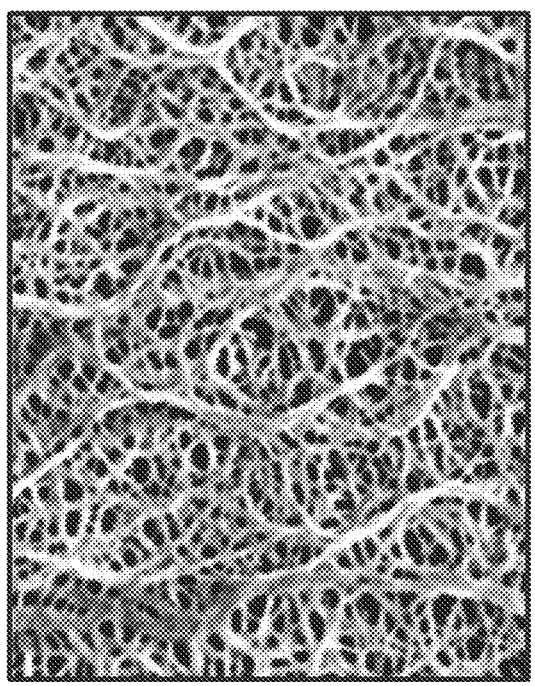

FIG. 2 shows a photograph (SEM) of Wet Process microporous separator membrane (prior art).

Figure 3:
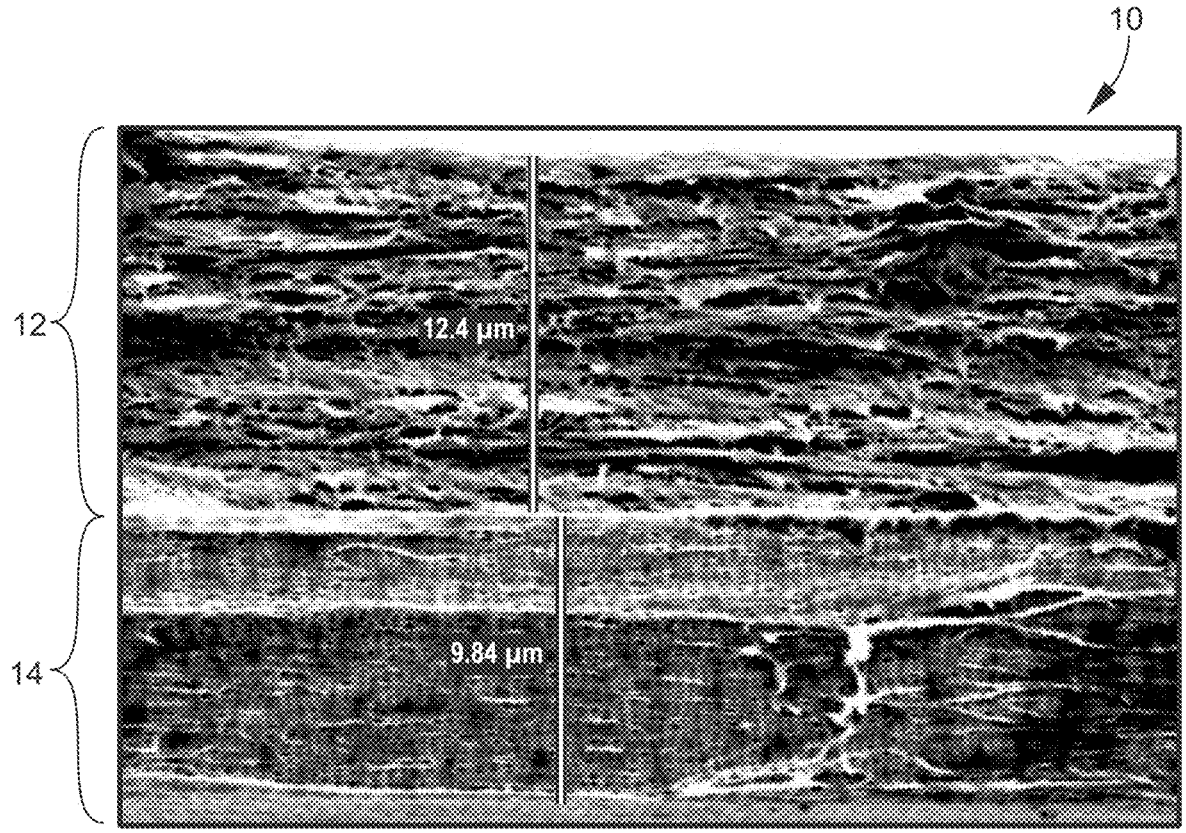

FIG. 3 shows a photograph (SEM, 3300×) of the hybrid microporous multilayered separator membrane (invention).

Figure 4:
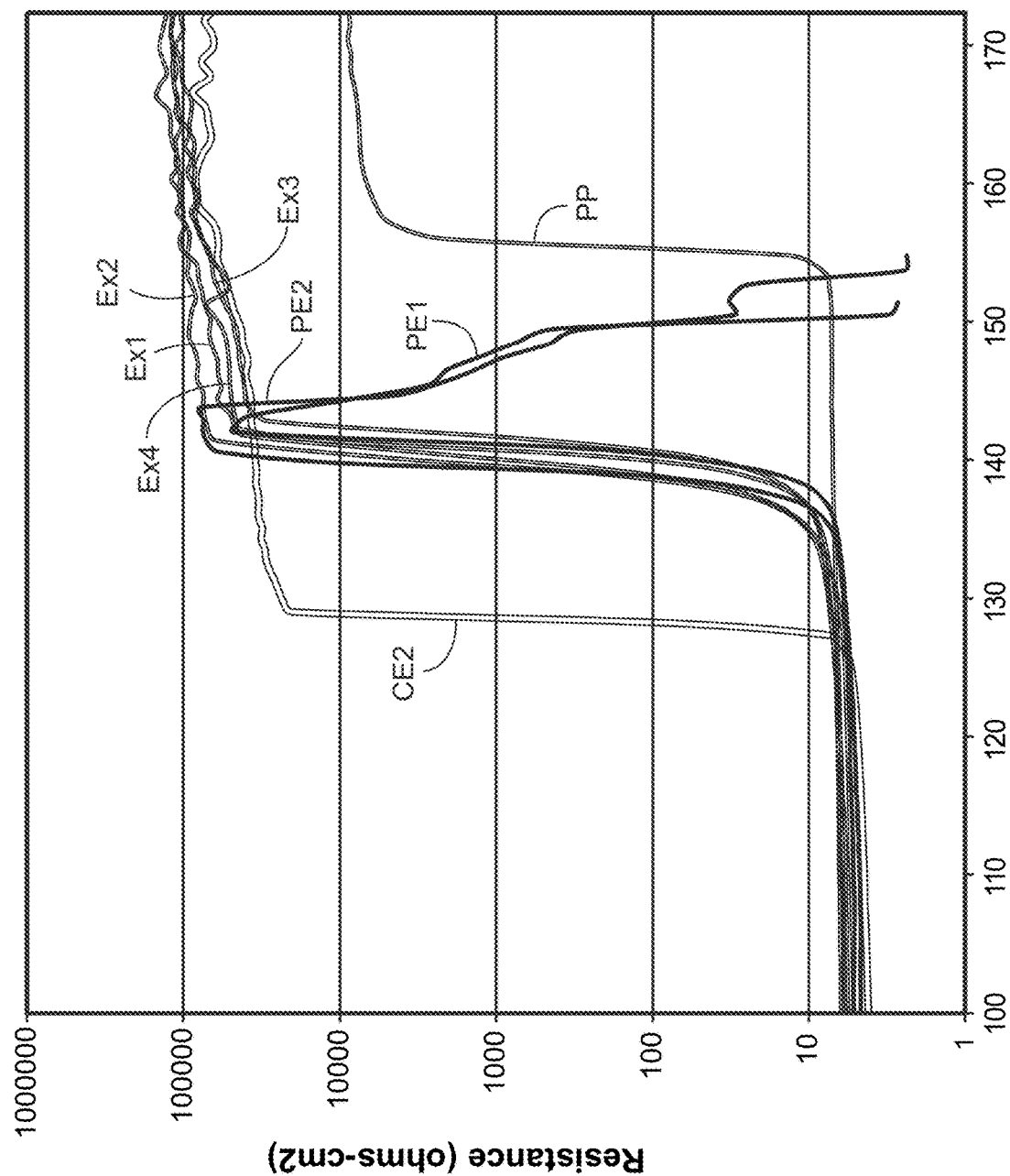

FIG. 4 is a graph comparing the electrical resistance (ER) thermogram of an inventive Separator to comparative patent example CE2.

DETAILED DESCRIPTION OF THE INVENTION

The present invention is, generally, a hybrid separator membrane which combines at least one layer of a membrane manufactured by a dry process with at least one layer of a membrane manufactured by a wet process. This separator membrane has excellent overall separator and battery performance properties which were achieved by the combination of dry and wet process separator membranes in a multilayer battery separator membrane construction.

Referring to FIG. 3, one embodiment of the hybrid separator 10 is shown. Separator 10 has two layers bonded together, top layer 12 and bottom layer 14. Top layer 12 may be made by a wet process. Top layer 12 may be made of a polyethylene based resin (discussed below). Bottom layer 14 may be made by a dry process. Bottom layer 14 may be made of a polypropylene based resin (discussed below).

The separator 10 is not limited to the embodiment shown in FIG. 3. Separator 10 may two or more layers, for example, two, three, four, five, or more (any whole numbers). In most embodiments, the number of layers may be two or three.

The configuration (or how the individual layer are stacked) may vary. In general, the separator may have one dry processed (DP) layer and one wet processed (WP) layer. The separator may have one polyethylene (PE) layer and one polypropylene (PP) layer. One embodiment is shown in FIG. 3 (DP-PP/WP-PE). In another embodiment, the separator may have the configuration of DP-PP/WP-PE/DP-PP. In other embodiments include, without limitation: DP-PP/WP-PE/DP-PP; DP-PP/WP-PE/DP-PP/WP-PE; DP-PP/WP-PE/WP-PE/DP-PP; and all permutation and combinations thereof.

Figure 1:
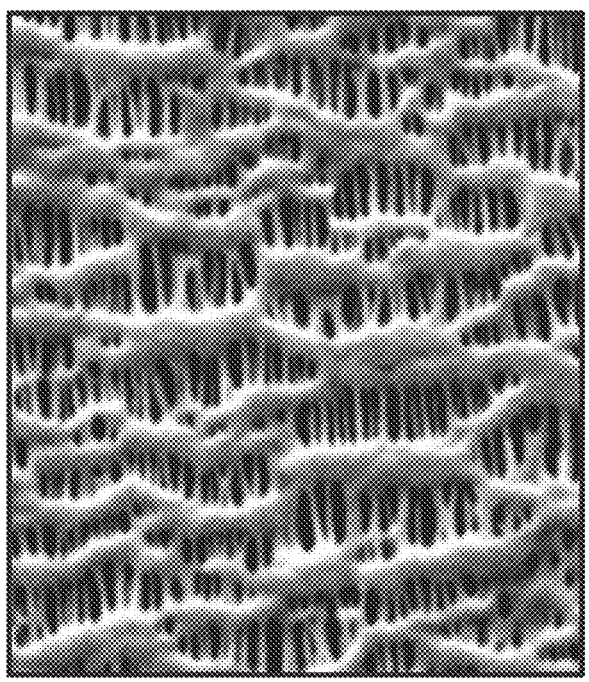
FIG. 1 shows a photograph (scanning electron microscope, SEM) of Dry

Dry process, as used herein, refers generally to the process of extruding thermoplastic resin into a parison (annular or flat), annealing the parison, stretching (uniaxially or biaxially) the annealed parison to form micropores, and, optionally, heat setting the microporous membrane. No solvent extraction is necessary, and no plasticizers are used to facilitate pore formation. The dry process is well known, for example see Kesting, *Synthetic Polymeric Membranes*, John Wiley & Sons, New York, N.Y. (1985), pages 290-297, incorporated herein by reference. The dry process produces a membrane with 'slit-like' pores, see FIG. 1, and that is structurally different form a membrane made by the wet process.

Wet process, as used herein, refers, generally to the process of extruding a thermoplastic resin and a plasticizer (the plasticizer is subsequently removed to form the micropores) into a flat sheet, cooling the flat sheet on a cool roll, stretching the cooled flat sheet, and extracting the plasticizer with a solvent for the plasticizer to form the microporous membrane. The wet process is based on the TIPS or 'phase-inversion' process (discussed above). The wet process is well known, for example see Kesting, *Synthetic Polymeric Membranes*, John Wiley & Sons, New York, N.Y. (1985), pages 237-286, incorporated herein by reference. The wet process produces a membrane with 'rounded' pore, see FIG. 2, and that is structurally different form a membrane made by the dry process.

Polyethylene based resin, as used herein, may refer to polyethylene or a blend of polyethylene. Polyethylene may be made from monomers of ethylene and co-monomers of ethylene. Blends of polyethylene may be made of polyethylene (at least 50%) and other thermoplastic resins. Polyethylene may have any molecular weight. Molecular weights may range from 100,000 to 5-6 million. Polyolefins molecular weights may be characterized as normal (about 100,000-400,000), high (about 400,000-800,000), and ultrahigh (about 1 million+). Typically, the dry process uses polyolefins in the normal and high molecular weight ranges. Typically, the wet process uses polyolefins in the high and ultrahigh ranges.

Polypropylene based resin, as used herein, may refer to polypropylene or a blend of polypropylene. Polypropylene may be made from monomers of propylene and co-monomers of propylene. Blends of polypropylene may be made of polypropylene (at least 50%) and other thermoplastic resins. Polypropylene may have any molecular weight.

Bonded to, as used, herein refers to any method for laminating one layer to the other without blinding of the micropores of the layers. Bonding may be by welding or the use of adhesives. Welding refers to thermal (heat), pressure, thermal and pressure, ultrasonic, and/or infrared. In one embodiment, the layers may be welded by the use of heat and pressure.

The separator may include as components of the layers, inert or ceramic particles, others resins (e.g., PVDF), as is known in the art. The resins used to make the layers may include other known additives (e.g., surfactants, anti-blocking agents, anti-oxidants, and the like) as is well known in the art. The separator may also include coatings, as is well known in the art.

The present invention may have a beneficial and unique set of properties that may make it particularly desirable as a separator for use in a lithium secondary battery. Those properties include, without limitation:

A ratio of TD/MD tensile strength (TD—transverse direction, MD—machine direction) may be in the range of about 1.5-3.0, or about 1.6-2.5, or about 1.8-2.2, or any subcombination included therein.

A thickness may be less than or equal to 35 microns (μm), or in a range of about 5-30 microns, or in a range of about 5-26 microns, or in a range of about 5-15 microns or any subcombination included therein.

A puncture strength may be greater than or equal to 630 gf (grams-force), or in a range of about 630-1500 gf, or in a range of about 680-1200 gf, or any subcombination included therein.

A dielectric breakdown may be at least 2000 V (volts), or in a range of about 2000-5000 V, or in a range of about 2200-4500 V, or any subcombination included therein.

The present invention shall be further illustrated in the following examples.

Bilayers of DP-PP/WP-PE and trilayers of DP-PP/WP-PE/DP-PP were prepared by thermally laminating selected base microporous membranes. Table 1 lists separator property data on both the monolayer membranes used in the bilayer and trilayer stacking configurations and the separator property data of the inventive component microporous multilayer separator membranes. Two comparative commercial separators CE1 with a thickness of 38 um and CE2 with a thickness of 25 um, which consist of a monolayer membranes made using dry process PE and PP microporous layers, have been included in Table 1 for comparative purposes.

TABLE 1

| Product | Bilayer Ex. 1 | Bilayer Ex. 2 | Trilayer Ex. 3 | Trilayer Ex. 4 | Trilayer CE 1 | Trilayer CE 2 | Monolayer base films | | |
|---|---|---|---|---|---|---|---|---|---|
| | | | | | | | PE 1 (wet) | PE2 (wet) | PP (dry) |
| Ratio of T PP:PE or PP:PE:PP | 8:12 | 8:16 | 8:12:8 | 8:16:8 | 12:12:12 | 8:8:8 | na | na | na |
| PE monolayer used | PE1 | PE2 | PE1 | PE2 | na | na | na | na | na |
| Thickness, um | 18.3 | 21.1 | 30.4 | 33.1 | 38.8 | 25 | 12.3 | 15.6 | 8.3 |
| BW, mg/cm$^2$ | 1.02 | 1.29 | 1.49 | 1.73 | 2.2 | 1.4 | 0.65 | 0.87 | 0.43 |

TABLE 1-continued

|  | Bilayer Ex. 1 | Bilayer Ex. 2 | Trilayer Ex. 3 | Trilayer Ex. 4 | Trilayer CE 1 | Trilayer CE 2 | Monolayer base films | | |
|---|---|---|---|---|---|---|---|---|---|
| Product | | | | | | | PE 1 (wet) | PE2 (wet) | PP (dry) |
| Gurley (ASTM), sec | 23.6 | 43.9 | 33.0 | 34.5 | 30 | 25 | 5.0 | 10.4 | 16.4 |
| % MD Shrinkage @ 90° C. | 6.6 | 5.7 | 7.7 | 6.6 | 4.4 | 8.4 | 2.0 | 2.0 | 13.3 |
| % MD Shrinkage @ 105° C. | 17.6 | 15.3 | 19.8 | 18.1 | 13.2 | 5.0 | 2.8 | 2.9 | 26.7 |
| % TD shrinkage @ 90° C. | 0.3 | −0.3 | −0.96 | −0.81 | −0.37 | −0.23 | 1.3 | −0.09 | −0.98 |
| % TD shrinkage @ 105° C. | 0.3 | 0.2 | 0.51 | −0.58 | −0.76 | −0.7 | 2.6 | 0.8 | −1.3 |
| Puncture Strength, gf | 710 | 836 | 812 | 978 | 622 | 380 | 487 | 514 | 201 |
| Tensile MD, kgf/cm$^2$ | 2079 | 1700 | 1735 | 1528 | 1281 | 1700 | 1957 | 1488 | 1334 |
| Tensile TD, kgf/cm$^2$ | 955 | 1062 | 683 | 792 | 125 | 150 | 1505 | 1620 | 100 |
| ER mohm/cm$^2$ | na | | 2.46 | 3.15 | 2.6 | 2.2 | 1.08 | 1.41 | 1.02 |
| Dielectric Breakdown, V | 2247 | 2637 | 3568 | 4191 | 4455 | 3522 | 1560 | 1923 | 470 |

Various thickness hybrid laminated membranes were prepared by laminating wet process PE and dry process PP of different thicknesses. A two-fold improvement in puncture strength was observed when comparing Example 3 which has a puncture strength of 812 gf compared to CE2 which has a puncture strength of 380 gf. Notable improvement was also observed in TD tensile strength when comparing Example 3 which has a TD tensile strength of 683 kgf/cm2 compared to that of CE1 and CE2 which has TD tensile strengths of 125 and 150 kgf/cm2, respectively. It should be noted that the inventive microporous separator membrane examples exhibit balanced MD and TD strength. When used in the battery manufacturing process of a lithium ion battery these separator membrane withstand the rigors of battery winding and are resistant to splitting in the TD direction. In addition, a separator membrane with balanced MD and TD tensile strength resists penetration by electrode particles that may be present during the battery winding operation. While an all PE wet process multilayer separator membrane would also exhibit balanced MD and TD tensile strength, this type of separator would not have the oxidative resistance provide by the PP layer in the inventive hybrid microporous separator membrane.

The data presented in Table 1 on bilayer separator membrane examples, Example 1 and Example 2, which range from 18 to 21 um in thickness, show a balanced MD and TD tensile strength, excellent puncture strength and high dielectric breakdown. The PP layer in the bilayer when placed against the cathode in a lithium ion battery provides excellent oxidative resistance during the cycling of the battery which leads to long cycle life. FIG. 3 is a SEM cross sectional view of bilayer Example 2 taken at a magnification of 3,300× with the PE layer shown as the top layer. The difference in the pore shape and micro structure is evident and a person skilled in the art can readily recognize the typical pore structure of the top PE wet layer as compared to the bottom PP dry process layer.

Hybrid multilayer samples were tested for Hot Electrical Resistance (Hot ER) to show thermal stability of the hybrid inventive membranes. Hot ER is a measure of the temperature that a porous membrane experiences shutdown, that is, the temperature at which the microporous membranes pores melt and close. FIG. 4 presents a Hot ER plot where electrical resistance of a membrane is plotted as a function of temperature. The inventive separators show a sharp increase in ER at 165 deg C as expected for membranes containing Polypropylene which are known to shutdown at approximately 165 deg C. Furthermore, the inventive hybrid separators continue to have very high sustained Electrical Resistance unlike the PE 1 and PE 2 membranes which exhibit a sharp reduction in ER at 130 deg C. The combination of a dry process PP membranes with a wet process PE membrane in both the bilayer and trilayer configurations produces a hybrid separator membrane which maintains a sustained level of electrical resistance at high temperature resulting in an improvement in battery safety at high operating temperatures.

Test Methods

Thickness (T)

Thickness is measured using the Emveco Microgage 210-A precision micrometer according to ASTM D374. Thickness values are reported in units of micrometers, μm.

Gurley

ASTM Gurley is a resistance to air flow measured by the Gurley Densometer (e.g. Model 4120). Gurley is the time in seconds required to pass 10 cc of air through one square inch of product under a pressure of 12.2 inches of water and is measured according to ASTM D726 (B).

Basis Weight (BW)

Basis Weight is determined using ASTM D3766 with units expressed in mg/cm2.

Shrinkage

Shrinkage is measured at two temperatures by placing a sample in an oven at 105 deg C for one hour and placing a second sample in an oven at 120 deg C for one hour. Shrinkage is measured in both machine direction (MD) and transverse direction (TD) and is reported as a % MD shrinkage and % TD shrinkage.

Tensile Properties

Machine Direction (MD) and Transverse Direction (TD) tensile strengths are measured using an Instron Model 4201 according to ASTM-882 procedure.

Puncture Strength

Puncture strength defined as the force required to puncture the test sample is measured using Instron model 4442 based on method ASTM D3763. Ten measurements were made across the width of the membrane and the average puncture strength was calculated.

Electrical Resistance (ER)

Electrical Resistance is defined as the Resistance value in mohm-cm$^2$ of a separator filled with an electrolyte.

Dielectric Breakdown (DB)

Voltage is applied to a separator membrane until the dielectric breakdown of the sample is observed. Strong Separator show high DB value where any non-uniformity in the membrane leads to low DB values.

The present invention may be embodied in other forms without departing from the spirit and the essential attributes thereof, and, accordingly, reference should be made to the appended claims, rather than to the foregoing specification, as indicated the scope of the invention.

We claim:

1. A multi-layered battery separator for a lithium secondary battery comprises: a first microporous layer of a first polypropylene-based dry-processed resin layer with slit like pores bonded to a second layer of a wet-processed membrane with rounded pores, wherein the separator has a thickness of from about 18 to about 35 microns, and a ratio of MD/TD tensile strength from 1.5 to 3; and which exhibits an electrical resistance of 50,000 ohms-cm$^2$ at temperatures greater than about 135° C. to at least about 175° C.

2. The separator of claim 1 wherein said separator further has a puncture strength of greater than about 630 gf.

3. The separator of claim 2 wherein said separator has a dielectric breakdown of at least about 2000 V.

4. The separator of claim 1 wherein said second layer is made of a polyethylene-based resin.

5. The separator of claim 4 wherein said polyethylene-based resin is polyethylene or a blend containing polyethylene.

6. The separator of claim 1 has more than two layers.

7. The separator of claim 6 has a configuration of a polypropylene layer/a polyethylene layer/a polypropylene layer.

8. The separator of claim 6 has a configuration of a dry processed membrane/a wet processed layer/a dry processed layer.

9. The separator of claim 1 has a ratio of TD/MD tensile strength in the range of about 1.5-3.0.

10. The separator of claim 1 has a ratio of TD/MD tensile strength in the range of about 1.6-2.5.

11. The separator of claim 1 has a ratio of TD/MD tensile strength in the range of about 1.8-2.2.

12. The separator of claim 1 has a thickness in the range of about 185.0-30.0 microns.

13. The separator of claim 1 has a thickness in the range of about 185.0-26.0 microns.

14. The separator of claim 1 has a puncture strength in the range of about 630-1500 gf.

15. The separator of claim 1 has a dielectric breakdown of at least about 2000 V.

16. The separator of claim 1 has a dielectric breakdown in the range of about 2000-5000 V.

* * * * *